(12) United States Patent  
Coronel et al.

(10) Patent No.: US 8,186,568 B2  
(45) Date of Patent: May 29, 2012

(54) ASSEMBLY OF TWO PARTS OF AN INTEGRATED ELECTRONIC CIRCUIT

(75) Inventors: Philippe Coronel, Barraux (FR); Perceval Coudrain, Grenoble (FR); Pascale Mazoyer, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 1134 days.

(21) Appl. No.: 12/035,297

(22) Filed: Feb. 21, 2008

(65) Prior Publication Data

US 2008/0205027 A1    Aug. 28, 2008

(30) Foreign Application Priority Data

Feb. 22, 2007    (FR) ...................................... 07 01269

(51) Int. Cl.  
*B23K 31/02*    (2006.01)

(52) U.S. Cl. .................. 228/175; 228/180.21; 228/198

(58) Field of Classification Search .................. None  
See application file for complete search history.

(56) References Cited

U.S. PATENT DOCUMENTS

| | | | | |
|---|---|---|---|---|
| 3,761,309 A | * | 9/1973 | Schmitter et al. ............. | 428/600 |
| 4,499,360 A | * | 2/1985 | Rottenbacher ............... | 219/85.2 |
| 4,704,785 A | * | 11/1987 | Curran .......................... | 438/455 |
| 5,028,454 A | * | 7/1991 | Lytle et al. .................... | 427/123 |
| 5,217,922 A | * | 6/1993 | Akasaki et al. ............... | 438/125 |
| 5,387,555 A | * | 2/1995 | Linn et al. ..................... | 438/455 |
| 5,419,806 A | | 5/1995 | Huebner ....................... | 156/645.1 |
| 5,704,116 A | * | 1/1998 | Gamota et al. ................ | 29/840 |
| 5,762,259 A | * | 6/1998 | Hubacher et al. ............. | 228/180.22 |
| 5,946,597 A | * | 8/1999 | Miura et al. ................... | 438/662 |
| 5,952,893 A | * | 9/1999 | Ghoshal ........................ | 331/108 C |
| 5,975,407 A | * | 11/1999 | Gasse et al. ................... | 228/121 |
| 5,975,408 A | * | 11/1999 | Goossen ........................ | 228/173.2 |
| 5,985,692 A | * | 11/1999 | Poenisch et al. ............... | 438/106 |
| 6,080,640 A | | 6/2000 | Gardner et al. ............... | 438/455 |
| 6,166,438 A | | 12/2000 | Davidson ...................... | 257/725 |
| 6,353,202 B1 | * | 3/2002 | Grotsch et al. ............... | 219/121.63 |
| 6,550,665 B1 | * | 4/2003 | Parrish et al. ................. | 228/180.22 |
| 6,590,287 B2 | * | 7/2003 | Ohuchi ......................... | 257/738 |
| 6,648,213 B1 | * | 11/2003 | Patterson et al. .............. | 228/223 |
| 6,649,833 B1 | * | 11/2003 | Caletka et al. ................ | 174/541 |
| 6,796,481 B2 | * | 9/2004 | Yamauchi ..................... | 228/180.1 |
| 7,191,515 B2 | * | 3/2007 | Sundahl et al. ................ | 29/830 |
| 7,213,739 B2 | * | 5/2007 | Wilson et al. ................. | 228/180.22 |
| 7,367,489 B2 | * | 5/2008 | Pendse ......................... | 228/180.22 |
| 7,611,041 B2 | * | 11/2009 | Tago et al. .................... | 228/180.22 |
| 7,731,077 B2 | * | 6/2010 | Farooq et al. ................. | 228/180.22 |
| 7,793,818 B2 | * | 9/2010 | Tago et al. .................... | 228/180.22 |

(Continued)

FOREIGN PATENT DOCUMENTS

JP    62-120037 A    *    6/1987

*Primary Examiner* — Kiley Stoner  
(74) *Attorney, Agent, or Firm* — Seed IP Law Group PLLC

(57) ABSTRACT

A process for assembling two parts of an integrated electronic circuit has two successive steps. During a first step, the two circuit parts are made into a single unit by molecular bonding, realized on respective application surfaces of the two parts. During a second step, electrical connections are formed from connection portions already present in the application surfaces of the two circuit parts. The connections formed extend across the bonding interface, and are compatible with a high reliability and a high level of integration of the circuit.

22 Claims, 2 Drawing Sheets

U.S. PATENT DOCUMENTS

| | | | |
|---|---|---|---|
| 2002/0056742 A1* | 5/2002 | Rinne | 228/226 |
| 2002/0074670 A1 | 6/2002 | Suga | 257/777 |
| 2003/0000998 A1* | 1/2003 | Yamauchi | 228/180.21 |
| 2004/0149808 A1* | 8/2004 | Bouche et al. | 228/122.1 |
| 2004/0232210 A1* | 11/2004 | Shah et al. | 228/180.22 |
| 2005/0170626 A1 | 8/2005 | Suga | 438/597 |
| 2005/0284920 A1* | 12/2005 | Martin et al. | 228/248.1 |
| 2006/0208030 A1* | 9/2006 | Caletka et al. | 228/41 |
| 2007/0158391 A1* | 7/2007 | Son et al. | 228/101 |
| 2007/0175969 A1* | 8/2007 | Wada et al. | 228/180.1 |
| 2007/0267461 A1* | 11/2007 | Yu et al. | 228/101 |
| 2009/0020590 A1* | 1/2009 | Knickerbocker et al. | 228/176 |

* cited by examiner

ASSEMBLY OF TWO PARTS OF AN INTEGRATED ELECTRONIC CIRCUIT

TECHNICAL FIELD

This disclosure generally relates to a process for assembling two parts of an integrated electronic circuit. More particularly but not exclusively, this disclosure concerns such a process wherein an electrical connection is realized between two parts of the circuit, essentially at the circuit integration level. This disclosure also concerns a circuit of the type obtained by such a process, as well as a circuit part adapted to be assembled according to this process.

BACKGROUND INFORMATION

In response to the demand for increasingly complex integrated electronic circuits, System in Package circuits or SiPs have been created. Such circuits combine several circuit parts which are realized on their respective substrates and which are assembled into the same package. Each circuit part can have a different function within the complete circuit, such as an outside connection function, a random access memory function, a multimedia communication function, a digital or analog baseband function, a radio function, a power supply function, a user interface function, etc.

Within the package, the different circuit parts are commonly connected to each other by wire bonding, or by solder bumps which connect connection pads oriented to face each other on each circuit part. Wire bonding is long and difficult to implement, and only allows the creation of electrical connections at the periphery of the circuit parts. The number of wire bonding connections is therefore limited. As for solder bumps, these can be placed all over the surface of an integrated electronic circuit part, but the number of electrical connections which can be implemented in this manner is limited by the size of the bumps relative to the size of the substrate of each circuit part, with this bump size ranging from several micrometers to several tens micrometers.

Various methods have therefore been proposed for realizing smaller connections between two parts of an integrated electronic circuit, when each circuit part is created from a separate substrate and each part therefore comprises transistors and connection levels superimposed above the transistor level.

In the first of these methods, the two substrates are first assembled in parallel, one atop the other, by molecular bonding or by use of an intermediate layer of polymer, then chimneys are etched, starting from the same external side of the assembly. An electrical connection is then realized between the two circuit parts by forming a conductive bridge on said side, connecting two chimneys filled with conductive material, each of which extends to an internal electrical connection of one of the two circuit parts. To implement this, one of the two chimneys must be particularly deep in order to traverse one of the substrates and the bonding interface between the two circuit parts. The chimney must have a cross-section large enough to allow filling the entire depth of the chimney with conductive material; therefore such connections cannot be made at a significant density in the assembled circuit. In addition, the process for manufacturing such a circuit with two parts is long and complex, because of the numerous specific additional steps which are necessary to form the connections which cross the bonding interface. Lastly, the presence of a polymer bonding layer is incompatible with certain high temperature processes applied to the circuit in a later step.

In a second of these methods, protruding metal pads are shaped on the surface of the two circuit parts, and connected to their respective electronic components as specified in the circuit design. These pads are arranged to come into contact in pairs when the two circuit parts are oriented to face each other. The assembly is then realized by metal bonding between the paired pads facing each other, compressing the two circuit portions together and simultaneously applying heat of between 300° C. and 400° C. However, the required compressive force is incompatible with the use of portions with low dielectric permittivity in each circuit part, because of the fragility of such dielectric portions.

In a third and last method, copper vias reach and overflow the surface of the two circuit parts. Portions of tin are built up onto the vias of one of the two circuit parts, then brought into contact with the vias of the other circuit part while heat is applied. These tin portions thus become solders which electrically connect the two circuit parts. However, the circuit assembly obtained in this manner is fragile.

BRIEF SUMMARY

One embodiment provides an integrated electronic circuit assembly, from two initially separate circuit parts, which does not have the drawbacks described above.

One embodiment provides a process for assembling two parts of an integrated electronic circuit, in which each circuit part initially comprises:
- one application surface, where at least one zone of said surface includes a material adapted to produce a molecular bond, and
- at least one electrical connection portion which ends at the application surface of this circuit part and which is arranged to be facing a connection portion of the other circuit part when the two application surfaces are brought into contact and aligned with each other.

In one embodiment, this process comprises the following successive:
/1/ assembling the two circuit parts together by molecular bonding of the application surfaces, such that the respective connection portions of the two circuit parts are facing each other, and
/2/ heating the circuit assembly so as to cause the formation of an electrically conducting alloy from the initial materials of the two connection portions in order to realize a connection which electrically connects the two assembled circuit parts.

An embodiment of the process thus has two distinct steps which are executed one after the other.

The first step includes assembling the two circuit parts by molecular bonding, then the second step includes electrically connecting the two circuit parts to each other. Because of this dissociation of the process, the first bonding step can be realized in a known and usual manner. It thus results in a complete circuit which has good mechanical strength. Indeed, during this first step, no electrical connection occurs which could hinder or interfere with the molecular bonding.

Then the second step includes heating to cause a chemical reaction, without adding material from an outside source. All the materials necessary for forming the connection are present in the two circuit parts before the first step, such that the second step is particularly simple to implement. In addition, both connection portions are formed within each part of the integrated electronic circuit initially, using the conventional techniques for adding material to a chip during fabrication, which are inexpensive.

The assembled circuit which is obtained by a process of one embodiment is a System in Package (SiP). It therefore has smaller total dimensions and only requires a single package.

A first feature of an embodiment therefore lies in the simplicity and rapidity of the process.

A second feature of an embodiment lies in the possibility of forming connections between the two circuit parts with a level of integration which is essentially equivalent to that of the connections internal to each circuit part. A large number of connections can thus be realized across the bonding interface, which allows the implementation of a complete complex circuit. In addition, all the connections between the two circuit parts, across the bonding interface, can be realized simultaneously in a single execution of an embodiment of the assembly process.

A third feature results from the fact that an embodiment of the process can be implemented circuit by circuit, meaning after each circuit part has been individually die cut in a silicon wafer corresponding to a series of simultaneously fabricated circuits. Alternatively, an embodiment of the process can be implemented for two silicon wafers which respectively have such a series for each circuit part before the circuit parts are cut, when these circuit parts appear at corresponding positions in each silicon wafer. Steps /1/ and /2/ can then be executed simultaneously for all circuit parts borne by the two wafers.

A fourth feature of an embodiment arises from the fact that the assembly process is compatible with the use of portions with low dielectric permittivity within each circuit part. In fact, each circuit part is not subjected to any high mechanical stresses during the process.

A fifth feature of an embodiment results from the compatibility of the obtained completed circuit with subsequent heat treatment at a higher temperature. No polymer materials are used for bonding the two circuit parts.

Lastly, an electrical connection realized according to an embodiment between the two circuit parts can be relatively short, because the molecular bonding interface uses a very small thickness for each circuit part. Such a connection then creates only a slight delay when it carries electrical signals from one part of the circuit to the other. The process of an embodiment is therefore compatible with the long term goals which have been established for the improvement of integrated electronic circuits. In particular, such a short connection can be obtained when each circuit part comprises a substrate on which are placed transistors and superimposed connection levels, and when the application surface of each circuit part is a surface of a last one of its connection levels, situated on a side opposite the substrate.

In one embodiment, at least one of the two initial portions of the connection which is realized in step /2/ may initially end at the application surface of the corresponding circuit part but be recessed relative to this surface. Such recessing of the initial connection portions guarantees that these portions do not form any protuberance relative to the application surfaces of the circuit parts, which could interfere with the formation of the molecular bond. The process is then even more robust with respect to the mechanical strength of the complete circuit.

In this case, the initial materials of the two connection portions are selected in order to form a link between the two connection portions across the recess(es). For example, the initial material(s) of one of the connection portions can be chosen so as to diffuse across the recess in step /2/ and thus come into contact with the other portion in order to form the conductive alloy.

Alternatively, the initial materials of the two connection portions may be selected such that the conductive alloy which is formed in step /2/ at least partially fills the recess by a volumetric expansion of the alloy relative to the initial materials. The connection between the two connection portions then results from this volumetric expansion, without requiring significant diffusion of one of the initial materials.

In one embodiment, at least one of the two connection portions may initially contain quantities of all the materials necessary to form a part of the conductive alloy within this portion, in accordance with the final chemical composition of this alloy in the circuit. The conductive alloy is first formed within this connection portion, then it establishes the connection with the connection portion of the other circuit part. A good electrical contact is thus ensured, with even more reliability in the connection, at least on the side of the portion which initially contains all the constituent materials of the alloy.

When the two perfections above are combined, the conductive alloy connection is initiated, then increases in volume in step /2/ starting from the connection portion which initially contains all the constituent materials of the alloy, filling in the recess. The robustness of the process in establishing a reliable electrical connection is then even greater.

An embodiment also provides an integrated electrical circuit as obtained by one embodiment of a process. This circuit comprises two parts which are assembled following a molecular bonding interface, and at least one connection which electrically connects these two parts to each other across the interface. The connection comprises a portion of conductive alloy which traverses the interface.

An embodiment provides an integrated electronic circuit part adapted to implement an assembly process of one embodiment. Such a circuit part comprises:

an application surface which is constituted, in at least one zone, of a material suitable for producing a molecular bonding, and at least one electrical connection portion which ends at this application surface, and which contains a quantity of a material able to form a conductive alloy when it is in contact with another appropriate material and heated.

BRIEF DESCRIPTION OF THE SEVERAL VIEWS OF THE DRAWINGS

Other features will become clear in the following description of two non-limiting embodiments, illustrated in the attached drawings, where.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

For reasons of clarity, the dimensions of the elements represented in these figures are not proportional to their actual sizes or size ratios. The figures are cross-sections of integrated electronic circuits during their fabrication. N indicates a direction for each circuit substrate used. The direction N is perpendicular to a flat surface of the substrate, and is oriented towards the exterior, across its surface. The words "on", "under", "below" and "above" which appear in the rest of this document are relative to this orientation for each substrate. In addition, the same references in different figures indicate the same elements.

Figure 1A:
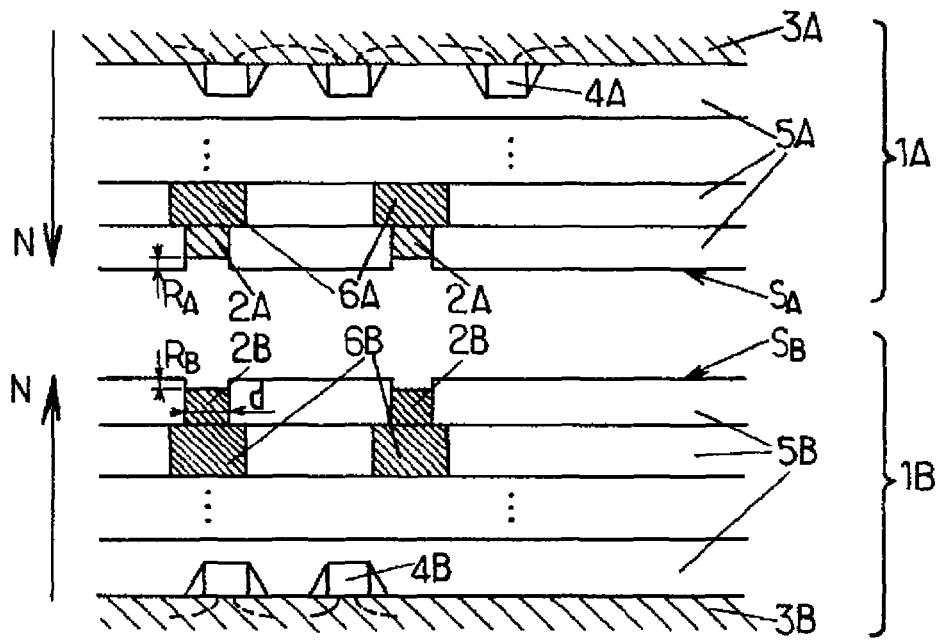
FIGS. 1a-1c illustrate different steps of a process for assembling an integrated electronic circuit according to one embodiment.

As is shown in FIG. 1a, a first part of an integrated electronic circuit, labeled 1A, may itself have a usual structure for an integrated electronic circuit. In particular, the circuit part 1A comprises a substrate 3A on which are placed transistors 4A which are represented in the diagram by MOS gate structures. Connection levels 5A are superimposed onto the substrate 3A, such that the upper surface $S_A$ of the part 1A, in the direction N for this circuit part, is the upper surface of one of the last of the connection levels 5A. This last level 5A is located on a side of the circuit part 1A opposite the substrate 3A.

The circuit part 1A may have a given hardware or software function within the completed circuit into which it is to be assembled. For example, this function can be an outside connection function, a random access memory function, a multimedia communication function, an analog or digital baseband function, a radio function, a power supply function, a user interface function, etc.

A second part of an integrated electronic circuit, which is labeled 1B, may have a structure analogous to that of the part 1A, without being identical to it in the electronic components of each circuit part, their layout, and their connections within it. The circuit part 1B may thus have a function which is different from that of the circuit part 1A. The reference numbers regarding the circuit part 1B are constructed in a manner similar to those for the part 1A, with the same meanings, except the letter A is replaced by the letter B.

The two circuit parts 1A and 1B are intended to be assembled by applying their respective surfaces $S_A$ and $S_B$ one against the other. For this reason, these surfaces are called application surfaces. In order to obtain a final assembly of the circuit parts 1A and 1B by molecular bonding, each circuit part 1A, 1B is initially based on silicon (Si) or silicon dioxide ($SiO_2$) in at least one zone of the corresponding application surface $S_A$, $S_B$. For example, the last connection levels 5A and 5B are constructed from layers of silicon dioxide which form the surfaces $S_A$ and $S_B$, excluding the electrical connection portions 2A, 2B which end at the surface of these levels. Alternatively, these last levels 5A and 5B may be partially covered by a silicon coating, out of the connection portions 2A, 2B.

The connection portions 2A and 2B, which belong to the circuit parts 1A and 1B respectively, are intended to connect these two circuit parts electrically in the final circuit assembly. To this purpose, the connection portions 2A and 2B are uncovered on surfaces $S_A$ and $S_B$, and as they are distributed on these surfaces in pairs, portions 2A, 2B of the same pair will face each other when the two circuit parts 1A and 1B are oriented towards each other in their final positions in the assembly. In other words, the connection portions 2A and 2B are respectively distributed on the surfaces $S_A$ and $S_B$ in a mirror symmetry relation. Within each circuit part, the connection portions 2A, 2B are electrically connected or otherwise electrically coupled to the electronic components of their circuit part by connection pathways 6A, 6B which are placed in the levels 5A, 5B.

The connection portions 2A, 2B may have very small transverse dimensions d, compatible with the level of integration of the circuit parts 1A, 1B. For example, these dimensions d may be on the order of 1 μm (micrometer), or even 0.2 μm, parallel to the surfaces $S_A$ and $S_B$. Smaller dimensions may also be used, particularly for one of the two connection portions when the other connection portion has dimensions compatible with the constraints for aligning the two circuit parts with each other. Such reduced dimensions d may be between 5 nm (nanometers) and 0.1 μm. Of course, the circuit parts 1A and 1B may each comprise a large number of such connection portions 2A and 2B, depending on what exchanges of electrical signals are necessary for the functions of these circuit parts.

During a first step of assembling the two circuit parts 1A and 1B, their application surfaces $S_A$ and $S_B$ are brought into contact with each other, aligning them such that the connection portions 2A and 2B are facing each other in pairs. A first heating of the assembly is performed in order to realize the molecular bonding. This molecular bonding step is realized in a manner which is known to a person skilled in the art. In particular for an embodiment, when the material for bonding the faces $S_A$ and $S_B$ is silicon dioxide, the temperature of this first heating can be about 300° C. When the bonding material is silicon, the bonding temperature is greater than 600° C.

The surfaces $S_A$ and $S_B$ are smoothed beforehand in order to obtain a solid bond, by polishing for example. They then have a low surface roughness, and no connection portion 2A, 2B projects beyond the level of the corresponding application surface in the direction N. In one embodiment, the connection portions 2A and 2B exhibit, at the time of the molecular bonding, respective recesses $R_A$ and $R_B$ relative to the application surfaces $S_A$ and $S_B$. Such recesses ensure in particular that the portions 2A and 2B will not protrude beyond the application surfaces during the bonding, for example because of thermal expansion of these portions relative to the surrounding materials of the connection levels 5A and 5B. These recesses may be between several tenths of a nanometer and 30 nm. For example, they can be equal to 10 nm. They may be obtained in particular by selective deposition of bonding material onto the last levels 5A, 5B, out of the portions 2A and 2B.

Figure 1B:
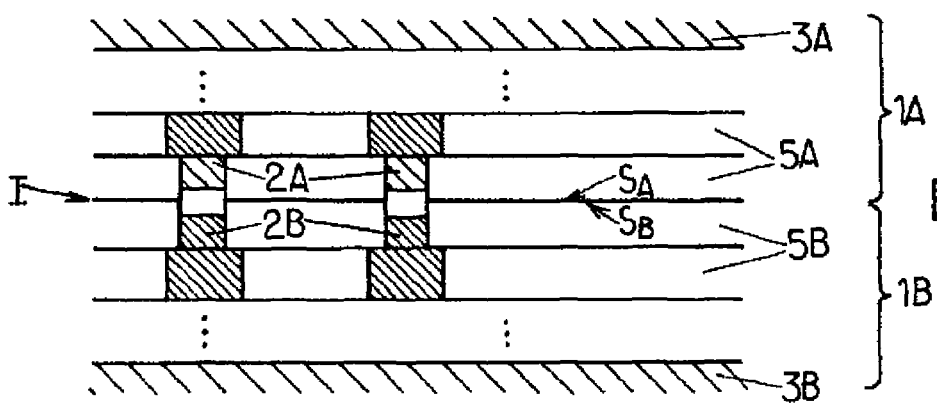

After the bonding, the configuration of the circuit is the one represented in FIG. 1b. Both circuit parts 1A and 1B are now one unit and the application surfaces $S_A$ and $S_B$ have merged to form a bonding interface labeled I.

A second step in the process comprises forming the electrical connections between the two circuit parts 1A and 1B, from the connection portions 2A and 2B.

Figure 1C:
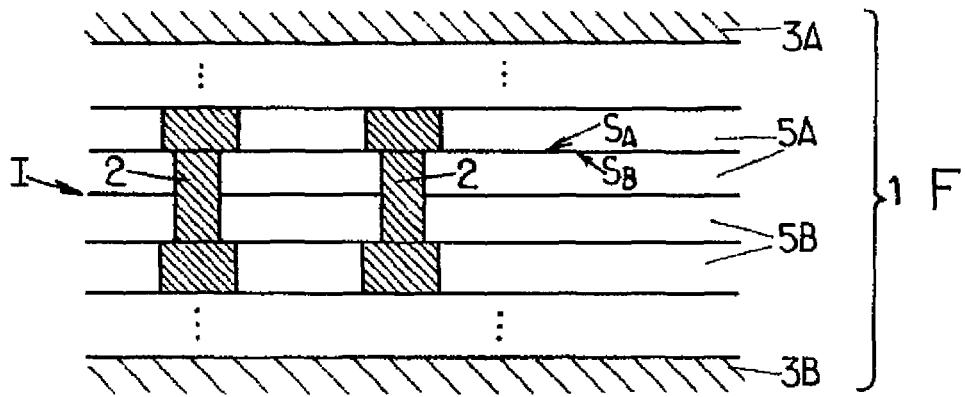

To this purpose, the two portions 2A and 2B of a same pair are respectively constituted of materials which are able to react chemically to form a conductive alloy. This alloy then establishes electrical continuity in the connection formed. The obtained connection is labeled 2 in FIG. 1c.

In a first embodiment, one of the two portions 2A, 2B of a same pair initially contains a quantity of silicon (Si), and the other portion of this pair initially contains at least one of the following metals: copper (Cu), cobalt (Co), nickel (Ni), titanium (Ti), tungsten (W), iridium (Ir), and platinum (Pt). The conductive alloy of the connection 2 is then a silicide of this metal, such as $CoSi_2$ or NiSi for example.

In a second embodiment, one of the two portions 2A, 2B of a same pair initially contains a quantity of copper (Cu), and the other portion of this pair initially contains a quantity of tin (Sn). The conductive alloy of the connection 2 is then an alloy of copper and tin, able to form a solder between the portions 2A and 2B. In particular, this alloy may have a stoichiometry close to that of $Cu_3Sn$.

The circuit is heated a second time in order to realize all the connections 2 simultaneously, forming the same number of conductive alloy portions. The temperature of this second heating can, for example, exceed 700° C., depending on the materials of the connection portions 2A and 2B. This second heating may also reinforce the molecular bonding which was done during the first heating.

When the connection portions 2A, 2B have recesses $R_A$, $R_B$, the second heating may be adapted to cause at least one of the materials in the portions 2A, 2B of a same pair to diffuse across the recesses $R_A$, $R_B$. This diffusion brings the initial materials of the portions 2A and 2B into contact, which then react to form the conductive alloy portion. The connection 2 thus at least partially fills in the recesses $R_A$ and $R_B$, forming a continuous electrical path which connects the two portions 2A and 2B.

In one embodiment, the formation of the conductive alloy of the connection 2 causes an overall volumetric expansion of the initial materials which chemically react at the end of the second heating. In other words, there is a positive change in the volumes of the materials involved in the chemical reaction which forms the conductive alloy, taking into account the stoichiometric coefficients of this reaction. The recesses $R_A$, $R_B$ can thus be completely or almost completely filled in.

Figure 2:
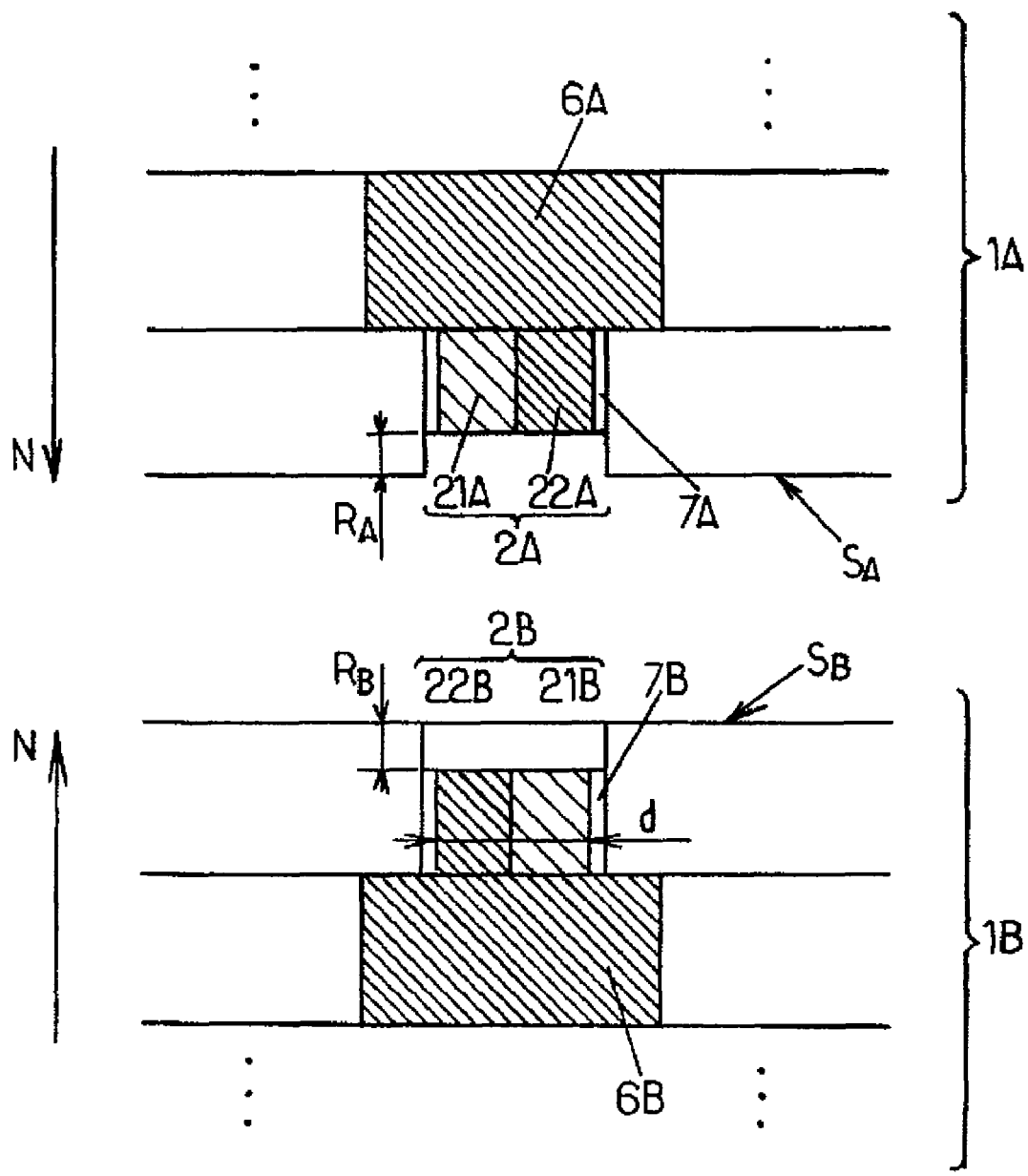
FIG. 2 illustrates a variant of the process in FIGS. 1a-1c according to an embodiment.

FIG. 2 illustrates an embodiment, wherein at least one of the connection portions 2A, 2B of a same pair itself initially incorporates all the initial materials necessary for the formation of the conductive alloy. Thus the conductive alloy is first formed within this connection portion during the second heating. This ensures the electrical functionality of this connection portion, particularly when all of this connection portion is converted into a conductive alloy. In addition, when this formation produces a volumetric expansion, the conductive alloy at least partially fills in the recess $R_A$, $R_B$ of this portion until a contact is established with the other connection portion which is oriented to face it. The reaction to form the conductive alloy can then continue with the initial material of the other connection portion, by diffusion across the currently forming connection 2.

In an embodiment, both connection portions 2A and 2B of a same pair each incorporate all the initial materials which are necessary for the reaction forming the conductive alloy. In this manner, the conductive alloy is first formed independently within each connection portion 2A, 2B during the second heating. When the formation of the conductive alloy produces a volumetric expansion, the two connection portions 2A, 2B expand simultaneously on each side of the bonding interface I and essentially merge at this interface in order to form the complete connection 2. The recesses $R_A$ and $R_B$ are then at least partially filled in, ensuring further more that the electrical connection will operate correctly.

In FIG. 2, each connection portion 2A, 2B, comprises two sub-portions of initial materials, respectively 21A, 22A, and 21B, 22B. For example, the sub-portions 21A and 21B are of polycrystalline silicon (poly-Si) and the sub-portions 22A and 22B are of cobalt (Co). The conductive alloy portion which forms the connection 2 is then of cobalt silicide ($CoSi_2$). For the represented configuration of the sub-portions, the connection 2 which is formed can completely replace the sub-portions 21A, 21B, 22A and 22B while simultaneously filling in the recesses $R_A$ and $R_B$. In other words, the connection 2 which is formed is homogeneous throughout the entire space available for it. It is then particularly reliable and has a low electrical resistance.

In addition, as represented in FIG. 2, the sub-portions 21A, 21B, 22A and 22B are initially arranged in an X relative to the bonding interface and the application direction of the circuit parts, and relative to the initial materials of these sub-portions.

In general, the connection portions which are used to connect electrically two circuit parts of an embodiment can be equipped with barrier effect layers within each circuit part. Such barrier effect layers avoid or reduce the atom exchange by diffusion which could occur between these connection portions and neighboring areas of the circuit. In this manner, the insulating or conductive properties of each circuit portion or component are preserved, particularly during the second heating of the circuit which is used to establish the electrical connections between the two circuit parts. Such barrier effect layers, labeled 7A and 7B in FIG. 2, can initially surround certain connection portions 2A, 2B, on the sides of these portions parallel to the direction N in particular.

Lastly, modifications to the embodiments detailed above can be provided. In particular, the two circuit parts which are assembled can have an orientation in the final circuit where the two substrates are turned in the same direction. Here, the application surface of one of the two circuit parts can still be the upper surface of the last connection level of the part, while the application surface for the other circuit part corresponds to a back surface of the corresponding substrate, on a side of the substrate opposite the connection levels it contains. In this case, the connection portions of the circuit part which is assembled by the back surface of the substrate can traverse the substrate of the part.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A process for assembling two parts of an integrated electronic circuit, wherein each circuit part initially includes:
   an application surface constituted, in at least one zone of said surface, of a material adapted to produce a molecular bond, and
   at least one electrical connection portion which ends adjacent to the application surface of said circuit part, and is arranged to be facing another connection portion of the other circuit part when the two application surfaces are brought into contact while aligned with each other, wherein said process comprises:
/1/ assembling the two circuit parts with each other by molecular bonding of the application surfaces, such that the respective connection portions of the two circuit parts are facing each other; and
/2/ heating the assembled circuit parts so as to cause a formation of an electrically conductive alloy from initial materials in the two connection portions, in order to realize an electrical connection between the two assembled circuit parts, wherein:
  at least one of the two initial materials of the connection portions ends adjacent to the application surface of the corresponding circuit part, with a recess relative to said surface; and
  the initial materials of the two connection portions are selected such that the conductive alloy formed in /2/ at least partially fills in said recess by a volumetric expansion of said alloy relative to said initial materials, establishing the electrical connection between said connection portions.

2. The process according to claim 1 wherein at least one of the portions of the electrical connection realized in /2/ contains, within said portion, quantities of all materials that form a part of the conductive alloy in accordance with a final chemical composition of said alloy.

3. The process according to claim 1 wherein each circuit part is initially based on silicon or silicon dioxide in at least one zone of the corresponding application surface.

4. A process for assembling two parts of an integrated electronic circuit, wherein each circuit part initially includes:
  an application surface constituted, in at least one zone of said surface, of a material adapted to produce a molecular bond, and
  at least one electrical connection portion which ends adjacent to the application surface of said circuit part, and is arranged to be facing another connection portion of the other circuit part if the two application surfaces are brought into contact while aligned with each other,
wherein said process comprises:
/1/ assembling the two circuit parts with each other by molecular bonding of the application surfaces, such that the respective connection portions of the two circuit parts are facing each other; and
/2/ heating the assembled circuit parts so as to cause a formation of an electrically conductive alloy from initial materials in the two connection portions, in order to realize an electrical connection between the two assembled circuit parts, wherein one of the two connection portions contains a quantity of silicon, and the other connection portion contains a metal that is at least one of copper, cobalt, nickel, titanium, tungsten, iridium, and platinum, with the conductive alloy formed being a silicide of said metal.

5. The process according claim 1 wherein one of the two connection portions contains a quantity of copper, and the other connection portion contains a quantity of tin, with the conductive alloy formed being an alloy of copper and tin.

6. A process for assembling two parts of an integrated electronic circuit, wherein each circuit part initially includes:
  an application surface constituted, in at least one zone of said surface, of a material adapted to produce a molecular bond, and
  at least one electrical connection portion which ends adjacent to the application surface of said circuit part, and is arranged to be facing another connection portion of the other circuit part if the two application surfaces are brought into contact while aligned with each other,
wherein said process comprises:
/1/ assembling the two circuit parts with each other by molecular bonding of the application surfaces, such that the respective connection portions of the two circuit parts are facing each other; and
/2/ heating the assembled circuit parts so as to cause a formation of an electrically conductive alloy from initial materials in the two connection portions, in order to realize an electrical connection between the two assembled circuit parts, wherein each circuit part includes a substrate on which are arranged transistors and superimposed connection levels, with the application surface of each circuit part being a surface of a last one of the connection levels of said circuit part, situated on a side opposite the corresponding substrate.

7. A process to assemble first and second parts of an electronic circuit, the process comprising:
  aligning a first electrical connection portion of said first part to a second electrical connection portion of said second part;
  molecularly bonding a first application surface of said first part to a second application surface of said second part, the first application surface being adjacent to and distinct from the first electrical connection portion and the second application surface being adjacent to and distinct from the second electrical connection portion; and
  applying heat to said molecularly bonded first and second parts to electrically couple the first electrical connection portion of said first part to the second electrical connection portion of said second part, said applied heat causing said aligned first and second electrical connection portions to form an electrically conductive alloy;
  wherein prior to said applying heat, said first electrical connection portion lies below said first application surface by an amount defining a first recess and said second electrical connection portion lies below said second application surface by an amount defining a second recess, wherein said applying heat to form said conductive alloy includes:
    heating said first and second electrical connection portions to cause a chemical reaction that forms said conductive alloy; and
    volumetrically expanding said formed conductive alloy relative to said first and second electrical connection portions to at least partially fill said first and second recesses.

8. A process to assemble first and second parts of an electronic circuit, the process comprising:
  aligning a first electrical connection portion of said first part to a second electrical connection portion of said second part;
  molecularly bonding a first application surface of said first part to a second application surface of said second part, the first application surface being adjacent to and distinct from the first electrical connection portion and the second application surface being adjacent to and distinct from the second electrical connection portion; and
  applying heat to said molecularly bonded first and second parts to electrically couple the first electrical connection portion of said first part to the second electrical connection portion of said second part, said applied heat causing said aligned first and second electrical connection portions to form an electrically conductive alloy;
  wherein said first electrical connection portion includes a first material and a second material different from said first material, and wherein said second electrical connection portion includes said first material and said second material, and wherein aligning said first electrical connection portion to said second connection portion includes:

aligning said first material of said first electrical connection portion to said second material of said second electrical connection portion; and aligning said second material of said first electrical connection portion to said first material of said second electrical connection portion.

9. A process, comprising:
assembling first and second parts of an electronic circuit, the first part having a first application surface and a first electrical connection portion and the second part having a second application surface and a second electrical connection portion, the assembling including:
forming a bonded connection of the first and second parts by molecularly bonding the first application surface to the second application surface; and
after forming the bonded connection, forming an alloyed connection of the first and second electrical connection portions, wherein said first electrical connection portion includes a first sub-portion of a first material and a second sub-portion of a second material different from said first material, and wherein said second electrical portion includes a first sub-portion of said first material and a second sub-portion of said second material, and wherein forming the alloyed connection includes:
forming a first alloyed portion by alloying the first and second sub-portions of the first electrical connection portion with each other;
forming a second alloyed portion by alloying the first and second sub-portions of the second electrical connection portion with each other; and
merging the first and second alloyed portions with each other.

10. The process of claim 9, wherein prior to forming the alloyed connection, said first electrical connection portion is recessed below said first application surface and said second electrical portion is recessed below said second application surface, wherein:
forming the alloyed connection includes expanding the first and second electrical connection portions into contact with one another, the expanding including heating said first and second electrical portions; and
the alloying includes heating the electrical connection portions.

11. The process of claim 9, wherein said molecularly bonding includes heating said first and second application surfaces.

12. The process of claim 9, wherein:
the first part includes a first substrate, a first circuit element arranged on the first substrate, and a first connection level arranged on the circuit elements and substrate;
the second part includes a second substrate, a second circuit element arranged on the second substrate, and a second connection level arranged on the circuit elements and substrate; and
the first and second application surfaces are respective surfaces of the first and second connection levels.

13. The process according to claim 4 wherein each circuit part is initially based on silicon or silicon dioxide in at least one zone of the corresponding application surface.

14. The process according claim 4 wherein one of the two connection portions contains a quantity of copper, and the other connection portion contains a quantity of tin, with the conductive alloy formed being an alloy of copper and tin.

15. The process according to claim 4 wherein each circuit part is initially based on silicon or silicon dioxide in at least one zone of the corresponding application surface.

16. The process according claim 4 wherein one of the two connection portions contains a quantity of copper, and the other connection portion contains a quantity of tin, with the conductive alloy formed being an alloy of copper and tin.

17. A process, comprising:
assembling first and second parts of an electronic circuit, the first part having a first application surface and a first electrical connection portion and the second part having a second application surface and a first electrical connection portion, the assembling including:
forming a bonded connection of the first and second parts by molecularly bonding the first application surface to the second application surface; and
after forming the bonded connection, forming an alloyed connection of the first and second electrical connection portions, wherein prior to forming the alloyed connection, said first electrical connection portion is recessed below said first application surface and said second electrical portion is recessed below said second application surface, wherein:
forming the alloyed connection includes expanding the first and second electrical connection portions into contact with one another, the expanding including heating said first and second electrical portions; and
the alloying includes heating the electrical connection portions.

18. The process of claim 17, wherein:
the first part includes a first substrate, a first circuit element arranged on the first substrate, and a first connection level arranged on the circuit elements and substrate;
the second part includes a second substrate, a second circuit element arranged on the second substrate, and a second connection level arranged on the circuit elements and substrate; and
the first and second application surfaces are respective surfaces of the first and second connection levels.

19. The process according to claim 17, wherein each circuit part is initially based on silicon or silicon dioxide in at least one zone of the corresponding application surface.

20. A process, comprising:
assembling first and second parts of an electronic circuit, the first part having a first application surface and a first electrical connection portion and the second part having a second application surface and a first electrical connection portion, the assembling including:
forming a bonded connection of the first and second parts by molecularly bonding the first application surface to the second application surface; and
after forming the bonded connection, forming an alloyed connection of the first and second electrical connection portions, wherein:
the first part includes a first substrate, a first circuit element arranged on the first substrate, and a first connection level arranged on the circuit elements and substrate;
the second part includes a second substrate, a second circuit element arranged on the second substrate, and a second connection level arranged on the circuit elements and substrate; and
the first and second application surfaces are respective surfaces of the first and second connection levels.

21. The process according to claim 20, wherein each of the first and second application surfaces includes at least one zone that is initially based on silicon or silicon dioxide.

22. The process according claim 20, wherein the first electrical connection portion contains a quantity of copper, and the second electrical connection portion contains a quantity of tin, with the conductive alloy formed being an alloy of copper and tin.

* * * * *